United States Patent [19]

Bil et al.

[11] 4,361,809
[45] Nov. 30, 1982

[54] BATTERY DIAGNOSTIC METHOD AND APPARATUS

[75] Inventors: Ronald J. Bil, Detroit; Robert H. Lewis, Farmington Hills, both of Mich.

[73] Assignee: Ford Motor Company, Dearborn, Mich.

[21] Appl. No.: 208,737

[22] Filed: Nov. 20, 1980

[51] Int. Cl.³ ............................................. G01N 27/42
[52] U.S. Cl. .................................... 324/426; 324/429
[58] Field of Search ................. 320/48; 324/426–428, 324/429, 433

[56] References Cited

U.S. PATENT DOCUMENTS

| | | |
|---|---|---|
| 3,392,328 | 7/1968 | Figg . |
| 3,500,167 | 3/1970 | Applegate ......................... 324/426 |
| 3,593,099 | 7/1971 | Scholl . |
| 3,680,072 | 7/1972 | Charbonnier et al. . |
| 3,808,487 | 4/1974 | Feuillade . |
| 3,857,087 | 12/1974 | Jones . |
| 3,876,931 | 4/1975 | Godshalk . |
| 3,969,667 | 7/1976 | McWilliams . |
| 4,044,300 | 8/1977 | Dupuis et al. . |
| 4,052,717 | 10/1977 | Arnold et al. . |
| 4,080,560 | 3/1978 | Abert ................................ 324/429 |

*Primary Examiner*—Michael J. Tokar
*Attorney, Agent, or Firm*—Peter Abolins; Clifford L. Sadler

[57] ABSTRACT

This specification discloses a method and apparatus for testing batteries in which a diagnostic cycle includes a discharge cycle and a charge cycle of five charging pulses and another discharge cycle. The discharge cycle durations are respectively one and twenty seconds. A typical duration for the charge cycle is 80 milliseconds. A plurality of voltages measured during this diagnostic cycle are used to evaluate five arithmetic functions. The results of the evaluation of three of the functions are compared against predetermined limits to determine battery quality. Additionally, the results of the evaluation of the remaining two functions are compared with one another to establish whether or not the battery is defective. This test provides a substantial advantage over prior art tests in that the test is substantially independent of battery temperature and battery size.

5 Claims, 2 Drawing Figures

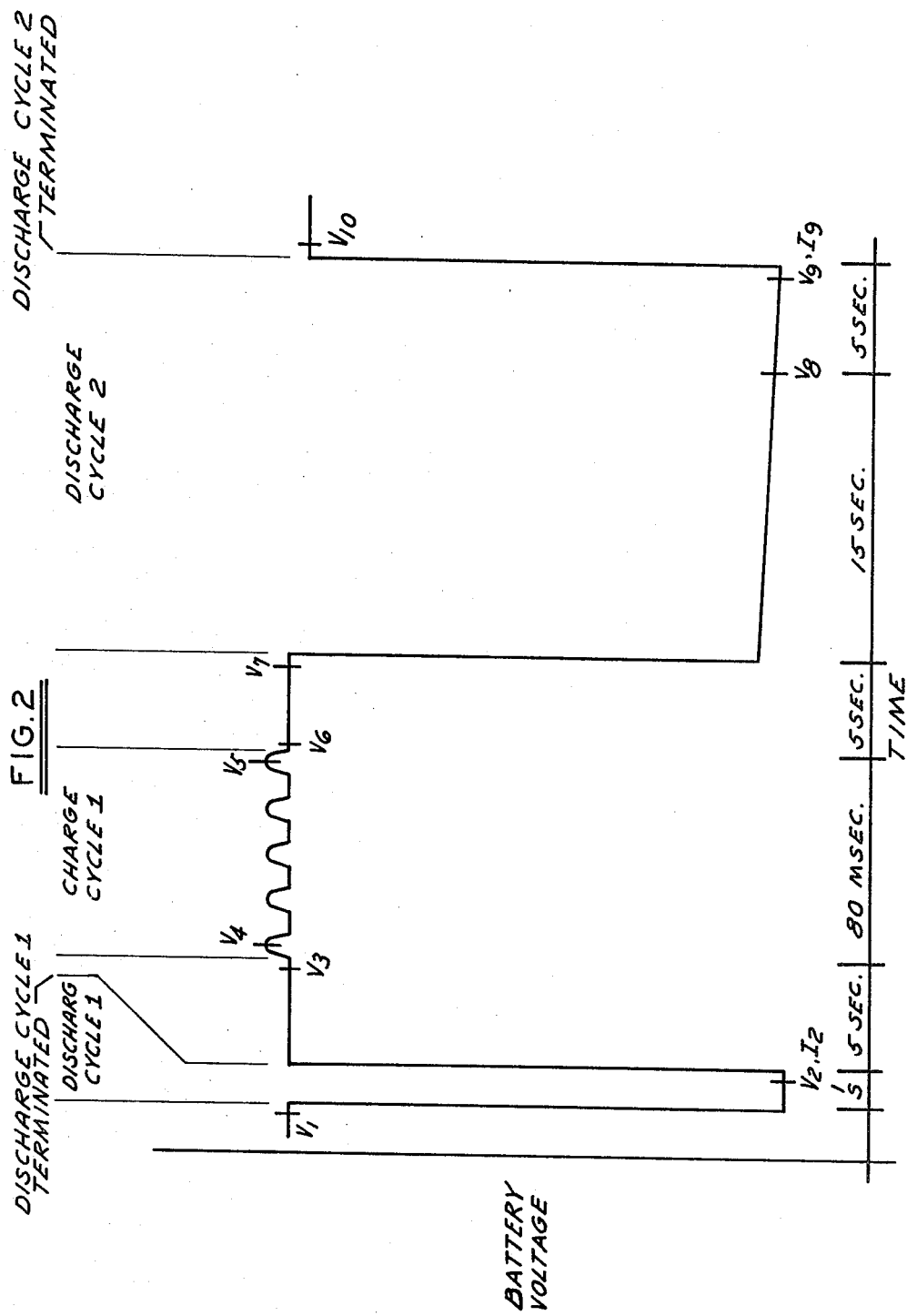

BATTERY DIAGNOSTIC METHOD AND APPARATUS

BACKGROUND OF THE INVENTION (1) Field of the Invention

This invention relates to storage batteries and, more particularly, to a method and apparatus for determining the maintenance and charge conditions of a lead storage battery.

(2) Prior Art

Known test techniques of testing lead acid batteries include a determination of physical properties of the individual cells, such as cell voltage or specific gravity. Such techniques have been greatly restricted in their usefulness by the advent of through the cell wall connectors and the maintenance free batteries. Accordingly, it would be desirable to have a battery tester based purely on electrical measurements at the battery post. Further, an electrical measurement, in contrast to a measurement with a hydrometer, can be readily incorporated into a computer diagnostic analysis which is often performed in the course of vehicle maintenance.

Prior art attempts to provide such electrical measurement devices and methods have not provided the required combination of accuracy, simplicity, ruggedness and low cost. In particular, prior art attempts have often been characterized by an inability to test batteries regardless of battery state of charge, battery temperature and battery capacity, and an inability to interface with a microprocessor based automatic test system. These are some of the problems this invention overcomes.

SUMMARY OF THE INVENTION

This invention recognizes the use of a comparison of two sets of parameters to identify the defective batteries. The first set of parameters are control or base line parameters developed during evaluation of a set of control batteries of known quality. The control batteries are subjected to a battery test including charging and discharging cycles. Since the quality of the control batteries is known, a parametric characterization for good/bad batteries is made using selected battery voltage samples measured during testing. The second set of parameters is derived from the battery voltage measurements taken while evaluating a battery of unknown quality. This battery is also subjected to the aforementioned battery testing including charging and discharging cycles and is thus characterized.

These measurements are readily adapted to a computer controlled diagnostic method such as that used when analyzing an automobile engine. Thus, no access to the battery electrolyte is required and a test can be performed by access to only the exterior of the battery.

In accordance with an embodiment of this invention, a method for testing a battery includes the step of applying a first discharge cycle followed by a charge cycle and a second discharge cycle. The charging cycle includes five charging pulses. The method includes a two part battery analysis technique to obtain a determination of battery condition as a result of the charging and discharging cycles. If the battery under test meets the criteria for a good battery during the first portion of the analysis, it is subjected to additional testing during a second portion of the analysis.

BRIEF DESCRIPTION OF THE DRAWINGS

FIG. 2 is a trace of voltage versus time for a test in accordance with an embodiment of this invention.

DETAILED DESCRIPTION OF THE INVENTION

Figure 1:
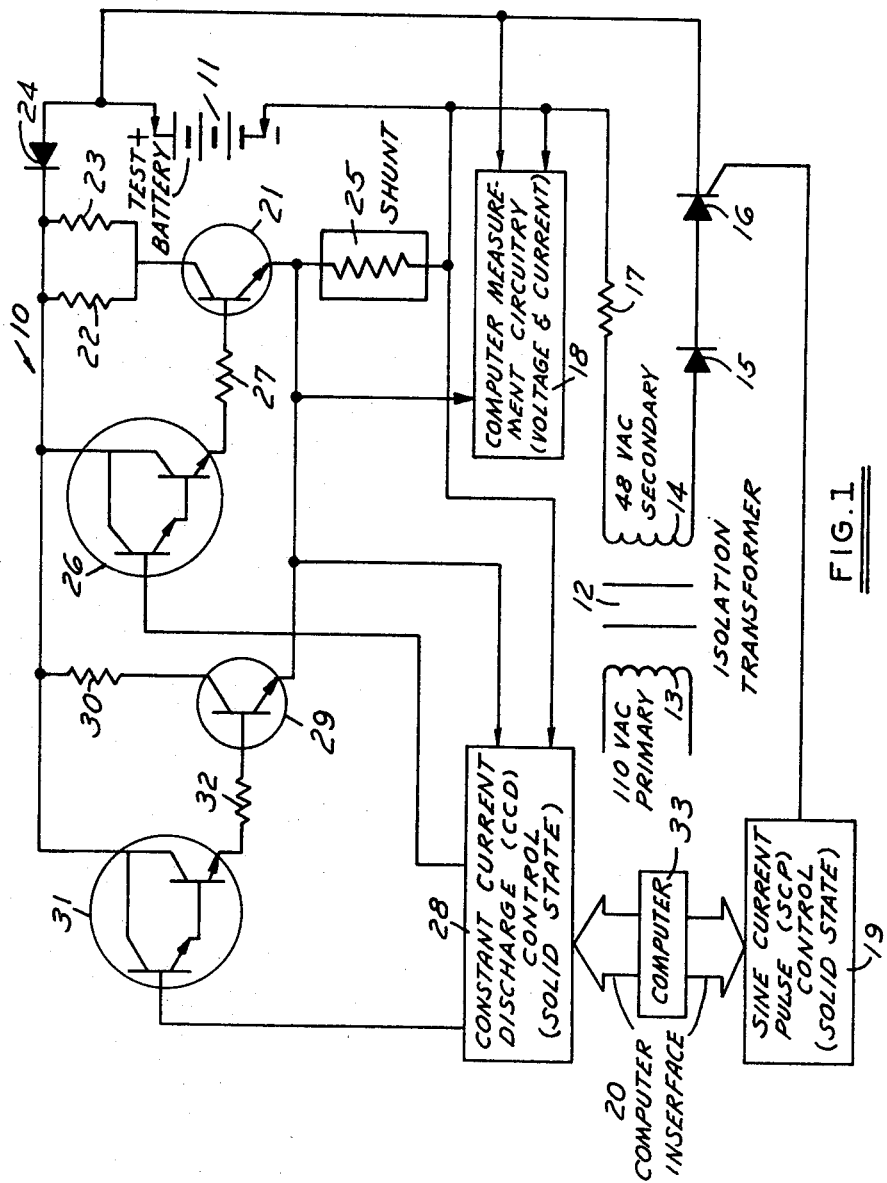
FIG. 1 is a schematic diagram of a test circuit for performing a test in accordance with an embodiment of this invention.

Battery diagnostic analysis in accordance with an embodiment of this invention is based on battery response to both charge and discharge cycles. Both of these are significant indications of the operating mode of a storage battery. The charge cycle can include five charging pulses derived from 110 volts AC. Such a voltage is readily available at a relatively low cost. Discharge cycles are characterized by a constant discharge rate which is maintained until battery voltage falls below a predetermined level. The constant current discharge technique provides for a consistent basis for analyzing battery discharge response. The battery diagnostic equations are derived from a control battery population made up of known acceptable quality batteries of various capacities and temperatures. As a result, battery diagnostics in accordance with an embodiment of this invention are not dependent upon battery capacity or battery temperature.

Referring to FIG. 1, a battery diagnostic test apparatus 10 is coupled to a test battery 11. An isolation transformr 12 has a primary coil 13 coupled to a 110 VAC source and a secondary coil 14 providing 48 VAC. Secondary coil 14 is coupled to the positive side of test battery 11 through the series combination of a diode 15 and a silicon controlled rectifier 16. Secondary coil 14 is coupled to the negative side of test battery 11 through a resistor 17. Computer measurement circuitry 18 for measuring voltage and current is coupled to both the positive side and the negative side of test battery 11. Computer measurement circuitry 18 can be a typical volt/ohm/ammeter which can communicate with a host microprocessor system. Silicon controlled rectifier 16 is activated by a sine current pulse control circuitry 19 thereby controlling application of secondary coil 14 voltage. Sine current pulse control circuitry 19 is coupled to and controlled by a microprocessor 33 through computer interface 20.

Additionally, a constant load power transistor 21 is coupled to the positive side of the test battery 11 through the parallel-series combination of resistors 22 and 23 and diode 24. Power transistor 21 is coupled to the negative side of the test battery 11 through a shunt resistor 25. Power transistor 21 is driven by Darlington transistor 26 through resistor 27. Darlington transistor 26 is activated by the constant current discharge control circuitry 28. The constant current discharge control circuitry 28 is coupled to and controlled by microprocessor 33 through computer interface 20.

A variable load power transistor 29 is coupled to the positive side of the test battery 11 through the series combination of resistors 30 and diode 24. Power transistor 29 is also coupled to the negative side of the test battery 11 through shunt resistor 25. Power transistor 29 is driven by a Darlington transistor 31 through resistor 32. Darlington transistor 31 is activated by constant current discharge control circuitry 28. Shunt resistor 25 is also coupled to constant discharge control 28 and the computer measurement circuitry 18.

The battery test sequence is initiated by microprocessor 33 through computer interface 20. The discharge cycles are controlled by the constant current discharge control 28. The constant current discharge control 28 maintains a constant current by instantaneously sampling the current at shunt resistor 25 and then controlling the current flow through Darlington transistor 31, resistor 32 and variable load power transistor 29.

The charge cycles are controlled by the sine current pulse control 19. The sine current pulse control 19 activates the silicon controlled rectifier 16 and allows only the appropriate number of charge pulses to pass. The battery voltage measurements necessary for the battery analysis are made through the computer measurement circuitry 18. The battery test consists of two discharge cycles and one charge cycle.

BATTERY DIAGNOSTIC TEST PROCEDURE

FIG. 2 depicts battery voltage behavior during a battery test sequence in accordance with an embodiment of this invention. The battery test consists of two discharge cycles and one charge cycle applied to the battery as illustrated. The discharge cycles are characterized by a constant current discharge rate which is maintained through an active load until battery voltage falls below a predetermined level. Discharge cycles 1 and 2 are applied for one and twenty seconds, respectively. The charge cycle is characterized by five charging pulses derived from 110 VAC. Each pulse consists of one cycle of the 110 VAC signal after it is passed through a step down transformer and a half wave rectifier circuit. Thus, each pulse has a maximum peak applied voltage of 48 V. Timing requirements related to application of discharge and charge cycles are specified in FIG. 2.

Voltage $V_1$, is measured just before the start of the first discharge cycle. Voltage $V_2$ is measured during the first discharge cycle. Voltage $V_3$ is measured after the end of the first discharge cycle and before the start of the charging cycle. Voltages $V_4$ and $V_5$ are measured at the peak of the first and fifth charging pulses, respectively. Voltages $V_6$ and $V_7$ are measured sequentially after the end of the charging cycle and before the beginning of the second discharging cycle. Voltages $V_8$ and $V_9$ are measured sequentially during the second discharge cycle. Voltage $V_{10}$ is measured after the end of the second discharge cycle.

Various parameters are sampled under computer control throughout the battery test sequence. These parameters, if properly manipulated, are directly related to battery quality. Battery diagnostic sampling requirements in accordance with an embodiment of this invention, include voltage measurements $V_1$ through $V_{10}$ and current measurements $I_2$ and $I_9$ as defined in FIG. 2.

The battery analysis method makes use of a two part battery analysis technique. The battery is defined as faulty during the first portion of the analysis if:

$F(1) <$ Test Limit 1
where $F(1) = V(8) - V(9)$
or if $F(2) >$ Test Limit 2
where $F(2) = V(10) - V(9)$
or if
$F(3) >$ Test Limit 3
where $F(3) = V(10) - V(2)$ Test limits 1, 2 and 3 have been established as equal to $F(1)$, $F(2)$ and $F(3)$, respectively, for a control group of known good quality batteries.

If the battery is not found to be defective during the first portion of the analysis, a second portion of the analysis is executed. $F(4)$ and $F(5)$ are evaluated where:

$F(4) = -1.542 \, V(2) + 2.482 \, V(10) - 9.405$
$F(5) = -0.460 \, V(2) + 1.521 \, V(10) - 5.825$

If $F(4) > F(5)$, the battery is defective.

The above described battery test in accordance with an embodiment of this invention is more accurate and effective than other currently available.

In summary the first portion of the analysis makes use of the battery voltage samples $V(2)$, $V(8)$, $V(9)$ and $V(10)$ defined in FIG. 2. The voltage sample values are inserted into three equations developed through data plot analysis of the control battery data set. The three equations are evaluated by the microprocessor and the results are compared against limits to identify defective batteries.

The second portion of the analysis makes use of battery voltage samples $V(2)$ and $V(10)$. The voltage sample values are inserted into two equations developed through a statistical analysis method called discriminate analysis of the control battery data set. The two equations are evaluated by the microprocessor and the results are compared against each other to determine battery condition.

Various modifications and variations will no doubt occur to those skilled in the various arts to which this invention pertains. For example, the number of times a battery is tested with a diagnostic cycle may vary from that disclosed herein. These and all other variations which basically rely on the teachings through which this disclosure has advanced the art are properly considered within the scope of this invention.

We claim:

1. A method for testing a battery comprising the steps of:
    varying the voltage across the battery during a testing cycle by:
    (a) applying a first discharging cycle to the battery;
    (b) terminating said first discharging cycle;
    (c) applying a first charging cycle to the battery, said first charging cycle including five charging pulses;
    (d) terminating said first charging cycle;
    (e) applying a second discharging cycle to the battery;
    (f) terminating said second discharging cycle;
    said first and second discharging cycles applying a constant current discharge rate through an active load to the battery; and
    measuring the voltage across the battery at selected times during said testing cycle, and comparing the magnitude of the voltage measurements to one predetermined reference value for each voltage measurement and to each other thereby determining the ability of the battery to retain a charge for a desired period of time, said step of measuring the voltage including the following:
    measuring a first voltage, $V_1$, before step (a);
    measuring a second voltage, $V_2$, during step (a);
    measuring a third voltage, $V_3$, between steps (b) and (c);
    measuring a fourth voltage, $V_4$, during step (c);
    measuring a fifth voltage, $V_5$, during step (c);
    measuring a sixth voltage, $V_6$, between steps (d) and (e);
    measuring a seventh voltage, $V_7$, between steps (d) and (e);
    measuring an eighth voltage, $V_8$, during step (e);

measuring a ninth voltage, $V_9$, during step (e); and
measuring a tenth voltage, $V_{10}$, after step (f).

2. A method of testing as recited in claim 1 wherein the steps of applying said first charging cycle includes applying first, second, third, fourth and fifth charging pulses comprising the positive portion of a sine wave having a repetition rate of sixty cycles per second.

3. A method for testing a lead acid battery comprising the steps of:
  applying one charge cycle to the battery, said charge cycle including five, separated charging pulses;
  applying two discharge cycles to the battery, each of said discharge cycles including maintaining a constant current discharge rate until battery voltage falls below a predetermined level, applying said two discharge cycles including applying a first discharge cycle for a period of one second and a second discharge cycle for a period of twenty seconds;
  applying said charge and discharge cycles in a sequence wherein said one second first discharge cycle takes place, said first charge cycle takes place, and said twenty second second discharge cycle takes place; and
  measuring the voltage across the battery at selected times during and after said charge cycle and said two discharge cycles and comparing the magnitude of the voltage measurements to one predetermined reference value for each voltage measurement and to each other thereby determining the ability of the battery to retain a charge for a desired length of time;
  said step of measuring the voltage across the battery including:
    measuring two voltages during said second discharge cycle; and
    measuring a voltage following completion of the second discharge cycle.

4. A method for testing a lead-acid battery as recited in claim 3 wherein the battery is defined as faulty during a first portion of the analysis if:
  $F(1) <$ Test Limit 1
  where $F(1) = V(8) - V(9)$
or if
  $F(2) >$ Test Limit 2
  where $F(2) = V(10) - V(9)$
or if
  $F(3) >$ Test Limit 3
  where $F(3) = V(10) - V(2)$
and wherein:
  $V(2)$ is defined to be a voltage at the end of the first discharge cycle;
  $V(8)$ is defined to be a voltage of the second discharge cycle at a point intermediate the beginning and the end of the discharge cycle;
  $V(9)$ is defined to be a voltage between $V(8)$ and the end of the second discharge cycle;
  $V(10)$ is a voltage following completion of the second discharge cycle.

5. A method for testing a lead-acid battery as recited in claim 4 wherein the battery is subjected to a further test if it is not found to be defective during the first portion of the analysis, said further test including evaluating $F(4)$ and $F(5)$, wherein:
  $F(4) = -1.542\ V(2) + 2.482\ V(10) - 9.405$
  $F(5) = -0.460\ V(2) + 1.521\ V(10) - 5.825$
so that when $F(4) > F(5)$, the battery is defective.

* * * * *